Dec. 19, 1972 M. D. PALMER 3,706,612

PROCESS FOR ETCHING SILICON NITRIDE

Filed July 16, 1968 2 Sheets-Sheet 1

BY

INVENTOR
Myron D. Palmer

ATTORNEYS

INVENTOR
*Myron D. Palmer*
BY *Sughrue, Rothwell, Mion, Zinn & Macpeak*
ATTORNEYS

United States Patent Office 3,706,612
Patented Dec. 19, 1972

3,706,612

PROCESS FOR ETCHING SILICON NITRIDE

Myron D. Palmer, Pleasant Valley, N.Y., assignor to International Business Machines Corporation, Armonk, N.Y.

Filed July 16, 1968, Ser. No. 745,292
Int. Cl. H01l 7/50
U.S. Cl. 156—17 9 Claims

ABSTRACT OF THE DISCLOSURE

A process for etching silicon nitride which comprises contacting a silicon nitride substrate with fused ammonium hydrogen phosphate at a temperature in the range of about 190° C. to 235° C. The preferred mole ratio of $NH_4$ to $PO_4$ is 0.8 to 1.5. The process finds particular applicability in etching a silicon nitride substrate which has been masked with a photo-resist.

BACKGROUND OF THE INVENTION

Field of the invention

The invention relates to a process for etching silicon nitride.

Description of the prior art

Recently, it has been appreciated that silicon nitride will perform many useful functions in the semi-conductor fabrication art, most commonly in those areas where silicon dioxide has formerly been used.

Silicon nitride has important properties which are very desirable in the fabrication of semi-conductor materials. It is chemically inert, thermally stable, resistant to thermal shock and forms excellent pinhole-free protective coatings.

However, serious problems have existed in the prior art when attempting to etch silicon nitride. Various processes and systems have been proposed, but these have been, for the large part, unsuccessful.

One commonly used method involves etching silicon nitride in phosphoric acid utilizing silicon dioxide as a mask. Generally, a two component system ($H_2O$-$P_2O_5$) has been utilized. When etching silicon nitride with phosphoric acid, it was found that critical control of the water concentration was necessary. In order to accomplish this, it was necessary to utilize elaborate equipment in order to reflux boiling phosphoric acid at temperatures of about 180° C. It was also necessary to utilize silicon dioxide as a mask, since conventional photo-resist materials would not mask sufficiently under the conditions described.

It has also been proposed to utilize various hydrofluoric acid solutions to etch silicon nitride. Serious problems were encountered utilizing this process, since conventional photo-resist materials cannot withstand the hydrofluoric acid solutions utilized under the conditions required to etch a silicon nitride film of a few hundred angstroms thickness.

In order to overcome the inoperability of common photo-resist materials under the hydrofluoric etching conditions commonly utilized, very complex and sophisticated chromium-silver masks have been utilized. Although operable, the expense due to the extra steps involved in exactly plating chromium and silver has proven this method to be economically unfeasible.

In opposition to the above methods, applicant's etching process enables silicon nitride to be etched utilizing common photo-resist materials without danger of photo-resist degradation. In addition, common photo-lithographic techniques are conveniently utilized in combination with applicant's novel etching process.

SUMMARY OF THE INVENTION

Applicant has discovered that silicon nitride films may be etched by utilizing fused ammonium hydrogen phosphate at a temperature within the range of about 190° C. to 235° C. as the etchant. The mole ratio of ammonium ions to phosphate ions must generally be maintained in the range of from about 0.8 to about 1.5, since present commercial photo-resists may break down outside this range. This limitation is a practical one, and not necessitated by the etchant-substrate combination per se. This etchant permits the direct use of photo-resist materials on the silicon nitride substrate, this being a primary object of the invention.

This process enables a great savings in time and labor to be realized, without the problems inherent in the prior art.

Silicon nitride may be utilized in many of the usages wherein silicon dioxide is presently used, especially in the semi-conductor fabrication art. Thus, it has been found that silicon nitride may form excellent junction seals in semi-conductor devices, thereby fulfilling the role of a passivation layer and a protective coating.

DESCRIPTION OF THE PREFERRED EMBODIMENTS

The present invention enables silicon nitride to be etched utilizing ammonium hydrogen phosphate and, most importantly, enables the direct usage of common photo-resist materials without ultra-sophisticated masking techniques.

In order to etch a silicon nitride substrate which has been masked with presently available commercial photo-resists with ammonium hydrogen phosphate, two important process parameters must be carefully controlled. The temperature of the etchant bath must generally be maintained between the temperatures of about 190° C. to about 235° C. In addition, for optimum results, the mole ratio of ammonium ions to phosphate ions should be maintained between about 0.8 to about 1.5.

The lowest temperature of operability of the present invention is determined by the solidification temperature of the etchant, i.e. about 190° C. Ammonium hydrogen phosphate begins to solidify at about 190° C., and it has been found that if the temperature falls below 190° C., etching rapidly decreases. At temperatures above 235° C., the etchant begins to decompose, with the evolution of ammonia gas, and process shut-down may be necessitated.

Generally, it has been found that 220° C. serves as a useful upper temperature limit for the etching process. This is because most common photo-resists begin to fail when subjected to conditions above this temperature.

Figure 1:
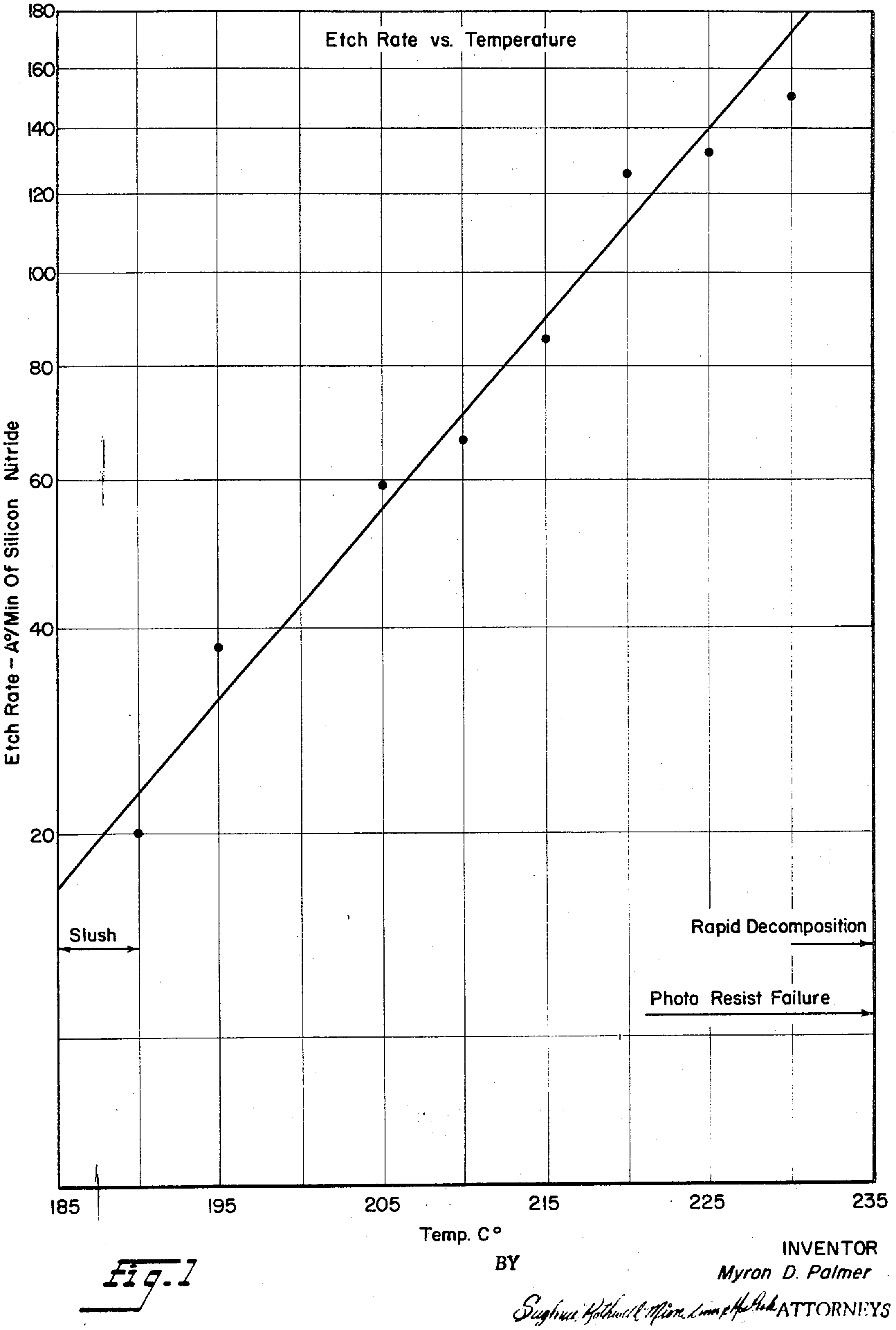
FIG. 1 is a graph which illustrates etch rates (angstroms/minute) versus temperature (degrees C.).
Figure 2:
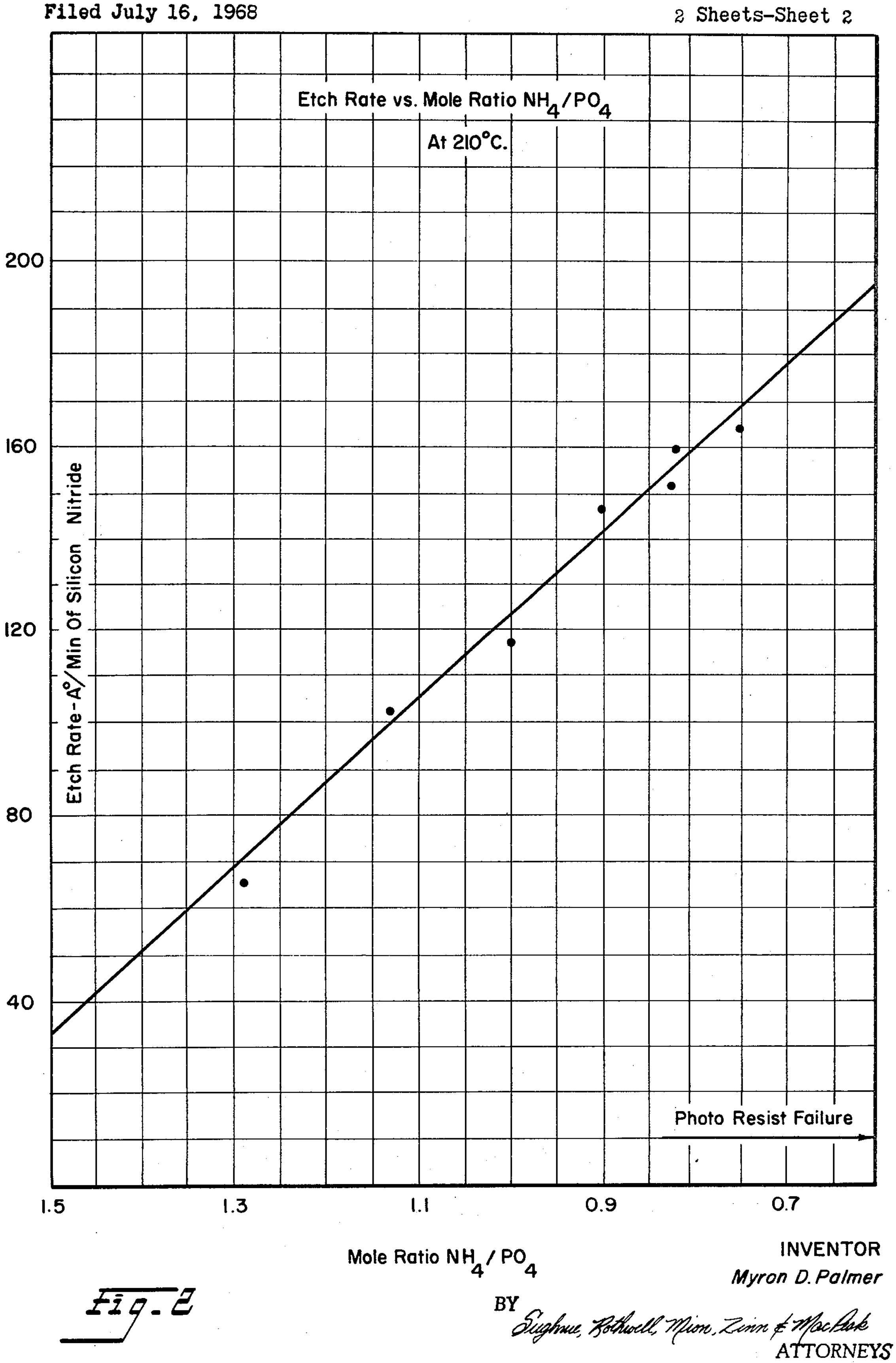
FIG. 2 is a graph which illustrates etch rates (angstroms/minute) at various mole ratios of ammonium ion concentration to phosphate ion concentration.

FIGS. 1 and 2 illustrate the general interrelationship of etch rate and mole concentration of the components of the system.

With reference to FIG. 1 of the drawings, it can be seen that the etch rate, given in angstroms per minute, increases linearly with temperature.

FIG. 2 of the drawings is a graphical representation of the rate at which silicon nitride is etched at varying mole ratios of ammonium ions to phosphate ions. The temperature was maintained constant at 210° C. while varying the mole ratio of ammonium to phosphate ions.

FIG. 2 illustrates that the etch rate increases linearly as the mole ratio of ammonium to phosphate ions decreases. The mole ratio, which is a unitless figure, represents the ammonium ion concentration in moles divided by the phosphate ion concentration in moles.

It should be noted that it is contemplated that mole ratios below 0.8 may be operable in the invention. However, 0.8 was determined to be the lower limit of the mole ratio for purely practical reasons. It has been found that if the ratio of ammonium to phosphate ions decreases below 0.8, photo-resist materials which are commercially available today begin to fail. Of course, should more resistant photo-resist materials become available in the future, it is felt that the mole ratio may be further decreased.

The upper mole ratio of ammonium to phosphate ions was also selected for practical reasons. It was found that if the mole ratio is increased to above 1.5, the rate of etching becomes so slow as to be commercially unfeasible. It will be appreciated, of course, that if time is of no essence, then lower etch rates may be acceptable, and the mole ratio of ammonium to phosphate ions may be increased beyond 1.5.

For comparative purposes, when ammonium hydrogen phosphate was utilized to etch phosphorus-doped silicon dioxide, an etch rate of 1,965 angstroms/minute was recorded; when utilized to each borosilicate glass or boron doped silicon dioxide, the etch rate was found to be approximately 143 angstroms/minute; and, when utilized to etch undoped silicon dioxide, the etch rate was found to vary between 0 and 20 angstroms/minute. It was felt that the deviation from a 0 etch rate was probably caused by impurities in the oxide used as samples. The above etch rates were also determined at 210° C.

It should be noted that all data in the present application was determined from etching experiments performed at approximately atmospheric pressure (14.7 p.s.i.). Accordingly, it is believed that some variation in the process parameters set out above may be accomplished by varying the pressure utilized during etching. It is believed that one skilled in the art of thermodynamics and chemical equilibrium will easily be able to determine extent to which the process parameters may be varied in response to an increase or decrease in process pressure.

Before reciting the specific detailed examples which set out the exact experimental conditions utilized during several etching processes, the general observations which follow will enable one skilled in the art to appreciate some of the ancillary features of the invention.

It has been found that agitation is very desirable during the etching process. It is believed that agitation serves two prime purposes: First, the agitation insures even heat distribution; and, secondly, agitation will insure uniformity of etching due to sufficient contact of etchant with the surface of the material being etched.

In addition, it is generally necessary to remove the etchant from the substrate, because the etchant, when removed from the etchant bath, will solidify and form a hard crust on the substrate. Although a variety of materials may be utilized to remove the etchant, it has been found most economical to utilize hot de-ionized water.

Although it is an important feature of this invention to enable silicon nitride to be etched while common photo-resists are in direct contact with the silicon nitride, no criticality may be attached to the photo-resist material utilized. The only criteria which the photo-resist must fill is that it must be able to withstand the high temperatures being utilized. Of course, it will be obvious to one skilled in the art that the photo-resist must be capable of adhering to the silicon nitride substrate without illustrating any tendency to creep at the high temperatures used. Some acceptable photo-resists (all manufactured and distributed by the Eastman Kodak Company, Rochester, N.Y.) are KPR–2, KPR–3, KTFR and KMER. It has also been found that Emulsitone photo-resist is operable in the present process.

If desired, a chemical surface active agent may be added to the etchant bath. It is believed that this reduces the surface tension of the bath so that the "drag-out" from the etching process will be greatly decreased.

In addition, fluoride ions may be added to the etchant bath to increase the rate of attack. However, resist adhesion will generally suffer if fluoride ions are added to the bath, and consequently great care must be taken.

In view of the above general remarks directed toward the present invention, the following specific examples are given to illustrate two process runs wherein photo-resist masked silicon nitride was etched utilizing ammonium hydrogen phosphate as the etchant.

EXAMPLE 1

The silicon nitride wafers were initially prepared by cleaning in a sulfuric acid solution.

The wafers were then given a short buffered HF treatment.

Pure KPR–2 was utilized as the resist material. This was applied and spun-accelerated at 3600 r.p.m. on a wafer spinner, in order to insure equal surface distribution. The resist coated wafer was then pre-baked for three minutes at 90 to 95° C. on a hot plate.

The wafer was then exposed in the desired configuration for 40 seconds with a 200 watt Osram bulb.

The KPR–2 was developed in the standard KPR developer available from Eastman-Kodak, and rinsed in two baths of butyl acetate.

The resist coated wafers were then post-baked for one hour at a temperature of 245° C.

A receptacle suitable to contain the silicon nitride wafers and etchant was prepared. Generally, it has been found that an electrical heating mantle may be utilized to supply the necessary heat to the etching reactor.

The wafers were placed in a freshly melted pool of ammonium hydrogen phosphate maintained at a temperature of 210° C.

Fifteen minutes were allowed for each 1000 angstroms of silicon nitride it was desired to move. At 210° C., this corresponded to an etch rate of 67 angstroms/minute, at a mole ratio of ammonium ions to phosphate ions of 1.02.

After 35 minutes, the silicon nitride wafers were removed from the etching apparatus.

The photo-resist was then stripped from the wafers and the wafers were rinsed.

The wafers were then placed in buffered HF to remove any underlying silicon dioxide.

The etching was complete, and was of the highest quality. Windows were etched in the silicon nitride and in the underlying silicon dioxide, and the windows were of a quality suitable for semi-conductor manufacture.

It should be noted that absorbed water may be contained in the ammonium hydrogen phosphate. As the phosphate melts, the majority of the absorbed water will be driven off. However, some absorbed water may be driven off during the etching process, and the wafers may float to the top of the etchant bath several times. Generally, all absorbed water will be driven off during the first fifteen minutes of etching, and thereafter the wafers will no longer float to the top. It was found that no harmful effects resulted from the wafers rising to the top of the etchant bath as long as the period of non-immersion was not significantly long.

EXAMPLE 2

The silicon nitride wafers were pre-etched for a period of about 30 seconds to about 1 minute. This was performed to remove any phosphosilicate or borosilicate glass formed during any diffusion processes to which the silicon nitride wafers had been subjected. In addition, pre-etching will help to prevent undercutting of the resist utilized. Phosphorus glass generally etched at a rate of about 1,965 angstroms/minute, and boron glasses etched at a rate of approximately 143 angstroms/minute. The temperature utilized in both etches was 210° C.

The wafers were then rinsed in flowing de-ionized water until all of the etchant was dissolved from the wafers. It is often desirable to continue the de-ionized water wash for a further period of time, such as ten minutes, in order to insure complete removal of all etchant.

The wafers were then pre-coated by immersing them in a 5% solution of hexamethyl disilizane in Freon TF for one minute. The wafers were then removed from the silizine bath, and any solvent present was allowed to evaporate from the surface of the wafers. This will increase adhesion in case the pre-etching treatment has not completely removed all of the doped glass.

The resist was applied at a thickness between 3000 and 6000 angstroms. Both KPR–2 and KTFR were utilized in two separate process runs. Generally, the lower limit of resist thickness will be determined by the cleanliness of the substrate and the pinhole density which can be tolerated in the fabricated device.

The wafers were then prebaked for three minutes at 100° C. on a hot plate.

The wafers were then exposed. It will be appreciated, of course, that exposure time will vary greatly, depending upon the exact type of equipment utilized. This may easily be determined by one skilled in the art.

The photo-resist utilized, either KPR–2 or KTFR, was then developed by placing the wafers in a recirculating bath of KOR developer (available from Eastman-Kodak) for ten seconds. This was followed by a ten second immersion in each of two recirculating baths containing n-butyl acetate.

In this process run, the backs of the wafers were coated with resist in order to prevent bubbles from forming on the wafers. The formation of bubbles may cause the wafers to float in the etch, and thereby some possibility of insufficient etching could occur if the period of non-immersion is sufficiently lengthy.

At this point, the etching conditions described in Example 1 were utilized on both the KPR–2 coated wafers and the KTFR coated wafers. Excellent results, as described in Example 1, were also noted.

The post-etch treatment was identical to that described in Example 1, with the exception that the wafers were baked in a nitrogen atmosphere for one hour at 230° C. The nitrogen will prevent oxidation of the resist, and by utilizing high temperatures, outgassing of the resist during etching, caused by the decomposition of any sensitizer present in the resist, will be prevented.

It should be noted that the time of etching is not of any great criticality. This is due to the fact that the rate of attack of intrinsic $SiO_2$ is exremely low, and the photo-resist will generally stand at least one hour of exposure to the etchant.

It will be appreciated, of course, that the length of time which a resist coated wafer can be maintained in the etchant bath will vary with the specific resist material utilized.

Generally, any of the standard materials utilized to remove resists from a substrate can be used. Normal sulphuric and chromic acid cleaning has been found to be completely adequate.

There appears to be no limit to the thickness of the nitride film which may be etched utilizing the present invention.

Of course, it is very important to maintain the surface of the nitride extremely clean prior to resist application. This is because undercutting is generally determined by the surface of the nitride, and if the surface of the nitride is clean, and the photo-resist is prepared and applied properly, there will be no undercutting.

In addition to suitably etching silicon nitride substrates, it is believed that any very highly doped silica may be etched utilizing the present process with substantial advantages over conventional photo-resist etching techniques wherein HF is utilized.

It will also be appreciated by one skilled in the art that the manner in which the silicon nitride is deposited may greatly affect the etch rate of ammonium phosphate.

While the process of the present invention finds usage in a great number of areas, the greatest present usefulness lies in processing the areas directly over thermal silicon dioxide which covers the active junction areas of a planar device. Of course, in some areas silicon dioxide may still be more preferable, i.e. such as for use over metal land patterns.

While the invention has been particularly shown and described with reference to preferred embodiments thereof, it will be understood by those skilled in the art that various changes in form and details may be made therein without departing from the spirit and scope of the invention.

What is claimed is:

1. A method for etching silicon nitride which comprises (a) contacting said silicon nitride with fused ammonium hydrogen phosphate at a temperature within the range of about 190° C. to about 235° C., and (b) maintaining said silicon nitride in contact with said fused ammonium hydrogen phosphate for a time sufficient to cause said fused ammonium hydrogen phosphate to etch said silicon nitride, and (c) removing said silicon nitride from said fused ammonium hydrogen phosphate.

2. A method as in claim 1 wherein said silicon nitride is masked with a photo-resist prior to contact with said fused ammonium hydrogen phosphate.

3. A method as in claim 1 wherein the ratio of ammonium ions to phosphate ions is within the range of from about 0.8 to about 1.5.

4. A method as in claim 1 wherein a surface active agent is present in said fused ammonium hydrogen phosphate.

5. The method of claim 1 wherein said ammonium hydrogen phosphate is agitated while being maintained in contact with said silicon nitride.

6. The method of claim 1 further comprising washing said silicon nitride after removal from said ammonium hydrogen phosphate.

7. The method of claim 8 wherein said washing is with deionized water.

8. The method of claim 1 wherein said temperature is 190° C. to about 220° C.

9. The method of claim 1 wherein the ratio of ammonium ions to phosphate ions is from 0.6 to about 1.5.

References Cited

UNITED STATES PATENTS

| | | | |
|---|---|---|---|
| 3,475,234 | 10/1969 | Kerwin et al. | 156—17 |
| 3,479,237 | 11/1969 | Bergh | 156—11 |

OTHER REFERENCES

Fink "Surface Treatment during Transistor Fabrication," IBM Technical Disclosure Bulletin (1245) vol. 10, No. 8, 1/68.

Mellor "A Comprehensive Treatise of Inorganic & Physical Chemistry," pp. 871–878 refer to Prost & von-Knorre on p. 873, vol. II, pub. 1946.

Woitsch, "Silicon Nitride Etching," in Solid State Technology, pp. 29–31 and 38, January 1968.

Sage et al., "Applications of Silicon Nitride," Powder Metallurgy, pp. 196–212, No. 8 (1961).

ROBERT F. BURNETT, Primary Examiner

R. T. ROCHE, Assistant Examiner

U.S. Cl. X.R.

156—2; 252—79.1

UNITED STATES PATENT OFFICE
CERTIFICATE OF CORRECTION

Patent No. 3,706,612 Dated December 19, 1972

Inventor(s) Myron D. Palmer

It is certified that error appears in the above-identified patent and that said Letters Patent are hereby corrected as shown below:

IN THE CLAIMS:

Column 6, Line 45
Claim 9, Line 1 change "8" to --6--

Signed and sealed this 22nd day of May 1973.

(SEAL)
Attest:

EDWARD M.FLETCHER,JR.
Attesting Officer

ROBERT GOTTSCHALK
Commissioner of Patents